(12) United States Patent
Baranov (10) Patent No.: US 12,253,547 B2
(45) Date of Patent: Mar. 18, 2025

(54) SINGLE WINDING CORE-INSENSITIVE FLUXGATE CURRENT SENSOR

(71) Applicant: ChargePoint, Inc., Campbell, CA (US)

(72) Inventor: Ivan Baranov, San Francisco, CA (US)

(73) Assignee: CHARGEPOINT, INC., Campbell, CA (US)

( * ) Notice: Subject to any disclaimer, the term of this patent is extended or adjusted under 35 U.S.C. 154(b) by 91 days.

(21) Appl. No.: 17/820,121

(22) Filed: Aug. 16, 2022

(65) Prior Publication Data

US 2024/0061024 A1 Feb. 22, 2024

(51) Int. Cl.
| | | |
|---|---|---|
| G01R 19/00 | (2006.01) | |
| G01R 15/14 | (2006.01) | |
| G01R 15/16 | (2006.01) | |
| G01R 33/04 | (2006.01) | |

(52) U.S. Cl.
CPC ....... *G01R 19/0092* (2013.01); *G01R 15/146* (2013.01); *G01R 15/16* (2013.01); *G01R 33/04* (2013.01)

(58) Field of Classification Search
CPC ... G01R 19/0092; G01R 15/146; G01R 15/16
See application file for complete search history.

(56) References Cited

U.S. PATENT DOCUMENTS

| | | | |
|---|---|---|---|
| 5,124,648 A | 6/1992 | Webb et al. | |
| 7,555,398 B2 * | 6/2009 | Fowler | G01C 17/00 |
| | | | 702/151 |
| 8,587,972 B2 * | 11/2013 | Deng | H02J 3/381 |
| | | | 363/95 |
| 9,261,571 B2 * | 2/2016 | Schaffer | G01R 33/04 |
| 9,291,648 B2 * | 3/2016 | Snoeij | G01R 19/0092 |
| 9,704,637 B2 * | 7/2017 | van Vroonhoven | H01F 27/427 |
| 10,459,040 B2 * | 10/2019 | Snoeij | G01R 33/022 |

(Continued)

OTHER PUBLICATIONS

Differential Current Sensor for IC-CPD acc. to the standard IEC62752-2016, Vacuumschmelze, Item No. T60404-N4641-X900, Nov. 10, 2021, 7 pages.

(Continued)

*Primary Examiner* — Dominic E Hawkins
(74) *Attorney, Agent, or Firm* — NICHOLSON DE VOS WEBSTER & ELLIOTT LLP (57) ABSTRACT

An open-loop fluxgate-type current sensor is described. The current sensor includes a single winding around a core that combines drive and sense that is used as both an excitation source and a feedback element to measure current through a primary winding. The current sensor further includes an H-bridge driver to impress voltage to the single winding to cause current to saturate the core, the voltage being impressed with opposing polarities repeatedly causing the core to saturate at opposing polarities. The current sensor further includes an analog transconductance integrator that continuously integrates the current to infer magnetizing force being driven into the core at the opposing polarities. The current sensor further includes a microcontroller unit (MCU) that calculates residual current based on the inferred magnetizing force being driven into the core at the opposing polarities and cause remedial action to be taken when the calculated residual current exceeds a threshold.

19 Claims, 6 Drawing Sheets

(56) References Cited

U.S. PATENT DOCUMENTS

| | | |
|---|---|---|
| 11,119,125 B2 | 9/2021 | Claeys |
| 2007/0064460 A1 | 3/2007 | Siman-Tov |
| 2015/0016006 A1* | 1/2015 | van Vroonhoven .. H01F 13/006 361/149 |
| 2015/0171882 A1 | 6/2015 | Van Veldhoven et al. |
| 2016/0202294 A1 | 7/2016 | Snoeij et al. |
| 2019/0267819 A1* | 8/2019 | Paek ....................... H02S 40/38 |
| 2020/0264245 A1 | 8/2020 | Erhart |

OTHER PUBLICATIONS

Introducing the CT6877, 2000 A AC/DC, 1 MHz, Attain greater accuracy when measuring the efficiency of increasingly high-current, high-speed EV/HEV inverters, HIOKI, AC/DC Current Sensor CT6877, CT6876, CT6875, May 17, 2021, 4 pages.

Current Transducer CDSR 0.07-NP, For the electronic measurement of current: DC, AC, pulsed . . . , with galvanic separation between the primary and the secondary circuit, LEM International SA, Feb. 3, 2021, 18 pages.

Current Transducer CDSR 0.07-TP, For the electronic measurement of current: DC, AC, pulsed . . . , with galvanic separation between the primary and the secondary circuit, LEM International SA, Jan. 14, 2021, 18 pages.

Data Sheet, Residual current circuit breaker DFS 4 025-2/0, 03-A EV sensitive to pulsating and alternating currents Type A, for electromobility with DC detection, Article No. 09124018, DOEPKE, downloaded Aug. 14, 2022, 3 pages.

Sensor Signal Conditioning IC for Closed-Loop Magnetic Current Sensor, DRV401, SBVS070B, Texas Instruments, Jun. 2006, 38 pages.

High Precision Current Transducers, High Precision Current Transducers Catalogue, LEM solutions for High Precision current measurement IT Current Transducers, LEM International SA, 30 pages.

Low voltage dual brush DC motor driver, STSPIN240, DocID029313 Rev 4, STMicroelectronics, Aug. 2017, 26 pages.

International Search Report and Written Opinion, PCT App. No. PCT/US23/30299, Dec. 4, 2023, 11 pages.

Liang Wang et al. Research on Small-Size Closed-Loop Fluxgate Transducer for Current Sensor Applications. Published in: 2019 22nd International Conference on Electrical Machines and Systems (ICEMS), Aug. 11, 2019, pp. 1-4.

* cited by examiner

SINGLE WINDING CORE-INSENSITIVE FLUXGATE CURRENT SENSOR

FIELD

Embodiments of the invention relate to the field of current sensors; and more specifically, to a single winding core-insensitive fluxgate current sensor.

BACKGROUND

Current sensors can be used to detect current leakage. Conventional current sensors have two or more windings such as one drive winding, one sense winding, one combined drive and sense winding, or other compensation windings, around a special high-quality core material that exhibits great Flux Density (B) vs magnetizing force (H) (BH) curve of a magnetic material, such as a good quality amorphous/nanocrystalline core material. The requirement of at least two windings adds cost as well the high quality amorphous/nanocrystalline core material.

SUMMARY

An open-loop fluxgate-type current sensor is described. The current sensor includes a single winding around a core that combines drive and sense that is used as both an excitation source and a feedback element to measure current through a primary winding. The current sensor further includes an H-bridge driver to impress voltage to the single winding to cause current to saturate the core, the voltage being impressed with opposing polarities repeatedly causing the core to saturate at opposing polarities. The current sensor further includes an analog transconductance integrator that continuously integrates the current to infer magnetizing force being driven into the core at the opposing polarities. The current sensor further includes a microcontroller unit (MCU) that calculates residual current based on the inferred magnetizing force being driven into the core at the opposing polarities and cause remedial action to be taken when the calculated residual current exceeds a threshold.

BRIEF DESCRIPTION OF THE DRAWINGS

The invention may best be understood by referring to the following description and accompanying drawings that are used to illustrate embodiments of the invention. In the drawings.

DESCRIPTION OF EMBODIMENTS

An open-loop fluxgate-type current sensor is described. The current sensor includes a single winding around a core (e.g., a toroidal core) that combines the drive and sense. A voltage is impressed on that single winding to drive the core into saturation and the resulting current is used to infer the magnetizing force (H) being driven into the core. A voltage is impressed into the single winding in the opposite direction to drive the core into saturation and the resulting current is used to infer the magnetizing force (H) being driven into the core. A full pseudo-differential measurement is determined based on the differences of the inferred magnetizing forces. Thus, the current sensor integrates the current through a saturable core to integrate the magnetizing force curve.

In an embodiment, the core is a toroidal shape and is made of amorphous or nanocrystalline tape-wound alloys. In another embodiment, the core is made of square Ferrite material (e.g., Ferroxcube 3R1), and may be of any kind of shape including a toroidal shape.

The combined sense and drive winding has one or more turns (e.g., 20 turns) that is used as both the excitation source and a feedback element to measure current through one or more primary windings.

In an embodiment, the open-loop fluxgate-type current sensor is used as part of a residual direct current detecting device of an electric vehicle service equipment.

Figure 1:
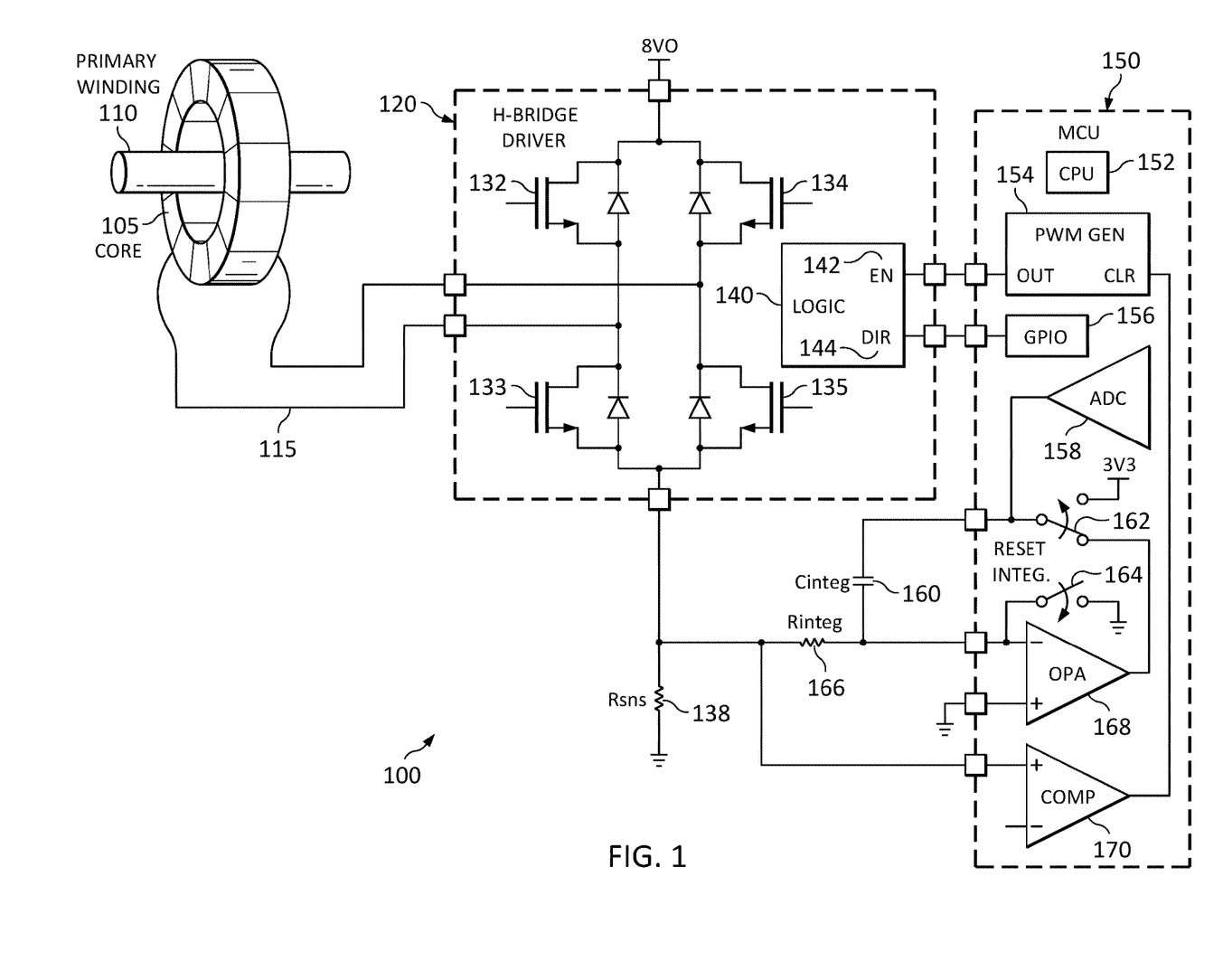
FIG. 1 illustrates an exemplary open-loop fluxgate-type current sensor 100 according to an embodiment.

FIG. 1 illustrates an exemplary open-loop fluxgate-type current sensor 100 according to an embodiment. The sensor front-end core is a core 105 that may have a square BH-curve characteristic. The core 105 may be a toroidal shape. The core 105 can be made of amorphous or nanocrystalline tape-wound alloys. In another embodiment, the core 105 is made of Ferrite material (e.g., Ferroxcube 3R1), and may be of any kind of shape including a toroidal shape.

The sensor 100 includes a single winding that combines sense and drive (the sense and drive winding 115). The single sense and drive winding 115 has one or more turns (e.g., twenty turns). The single sense and drive winding 115 is used as both the excitation source and a feedback element to measure current through the primary winding 110. The primary winding 110 may be a current conductor and the residual/leakage current of which is measured by the current sensor. There may be multiple primary windings. For example, in a three-phase power system, there may be four primary windings (three for the power providing phases and one for the neutral conductor).

The sensor 100 includes the h-bridge driver 120 that is controlled by the MCU 150. For instance, the MCU 150 provides signaling to control the h-bridge driver 120. The h-bridge driver 120 impresses a voltage onto the sense and drive winding 115 with opposing polarities repeatedly, causing the core 105 to saturate (e.g., clockwise, counter-clockwise, clockwise, etc.). In an embodiment where the core 105 has a square BH-curve characteristic, the saturation of the core 105 is at approximately the coercive force (Hc) of the core 105. This current is continuously integrated into a capacitor Cinteg 160 with unlimited resolution in the analog domain.

The h-bridge driver 120 includes the combinational logic 140 that translates from the enable (EN) pin 142 and the direction (DIR) pin 144 to the h-bridge driver circuit that includes the MOSFETs 132-135.

The MCU 150 includes the CPU 152, the Pulse-Width Modulation (PWM) generator 154, the general-purpose input/output (GPIO) pins 156, the analog to digital converter (ADC) 158, the operational amplifier 168, and the comparator 170. The MCU 150 may include other components that are not necessary to understanding of embodiments described herein.

The sensor 100 includes an analog transconductance integrator whose output is a current integral (and therefore the magnetizing force integral) after one half-cycle. The analog transconductance integrator includes the resistor Rsns 138, the resister Rinteg 166, the capacitor Cinteg 160, and the operational amplifier 168. The resistor Rsns 138 is used for measuring real-time current going through the sense and drive winding 115 and provide a voltage to the MCU 150. The resistor Rsns 138 may be a sense shunt resistor. The operational amplifier 168 of the MCU 150 integrates the voltage provided by the resistor Rsns 138.

The MCU 150 resets the analog integrator by reconfiguring the pins as GPIOs between analog and op-amp mode dynamically. This charges or discharges, depending on whether the integrator is inverting, the capacitor Cinteg 160. This reconfiguration is represented as elements 162 and 164 where the voltage levels to which the integrator is reset is controlled by the GPIO (e.g., element 162 goes to 3.3V and element 164 goes to ground). The MCU 150 signals to the h-bridge driver 120 to impress a voltage on a first polarity onto the front-end core 105 (e.g., clockwise), causing current to saturate the core 105. This current is continuously integrated into the capacitor Cinteg 160. For instance, the PWM generator 154 signals an enable signal to the enable pin 142 to impress the voltage onto the front-end core 105. The direction input signals the differential coil magnetization direction (e.g., clockwise when off, counterclockwise when on). The PWM generator 154 is reset from the output of the comparator 170.

Current through the sense and drive winding 115 will rise above a threshold indicating core saturation, such as when the current through resistor Rsns 138 has reached a threshold (e.g., 100 MA). When the voltage across the resistor Rsns 138 reaches the threshold, the MCU 150 signals the h-bridge driver 120 to stop driving current thereby switching off the PWM generator 154 and concluding the saturation cycle. The time from when the voltage is impressed to the time the core is saturated is measured with a timer, and referred herein as the saturation time, and that saturation time value is stored. The final current integral value at the time the h-bridge driver 120 stops driving current (the voltage stored on capacitor Cinteg 160) is read by the ADC 158. This final current integral value is stored. The MCU resets the analog integrator and begins the process again but by impressing the voltage at a second polarity (the reverse polarity) onto the front-end core 105 (e.g., counterclockwise). For instance, current rises above the threshold indicating core saturation and the h-bridge driver 120 stops driving current. The saturation time in this interaction is determined and stored, and the final current integral value is read by the ADC 158.

The MCU 150 calculates the residual current through the front-end that caused the magnetizing force integral asymmetry based on the saturation time, the final integral value obtained in this iteration, and the final integral value obtained in the immediately prior iteration. In an embodiment, the residual current is calculated according to the following formula:

$$I_{residual} = ((Va - Vb) * (Rinteg * Cinteg) / (Rsns) * N) / (2 * Saturation\_Time)$$

where Va is the final integral value obtained in this iteration, Vb is the final integral value obtained in the immediately prior iteration, Rinteg is the resistance value of the resistor Rinteg 166 (e.g., 2.2K Ohm), Cinteg is the capacitance value of the capacitor Cinteg 160 (e.g., 10 nF), Rsns is the resistance value of the resistor Rsns 138 (e.g., 4.7 Ohm), N is the number of turns on the combined sense and drive winding (e.g., 20), and Saturation_Time is how long it took to saturate the core in this iteration. The calculation may be performed many times per second (e.g., 4800 times per second).

If the calculated residual current exceeds a threshold (e.g., above 6 milliamps), remedial action may be taken. The value of the threshold can be different in different circumstances. For example, the threshold could be between a value between 4.5 milliamps to 6 milliamps for a DC implementation, and between 15 milliamps to 20 milliamps for an AC implementation. The remedial action may include the MCU 150 causing the contactors to open. In some cases, the current sensor 100 may be used in environments where the contactors remain open until they are manually reset. In other cases, the current sensor 100 may be used in environments where the contactors can be remotely reset if certain conditions are met.

Figure 2:
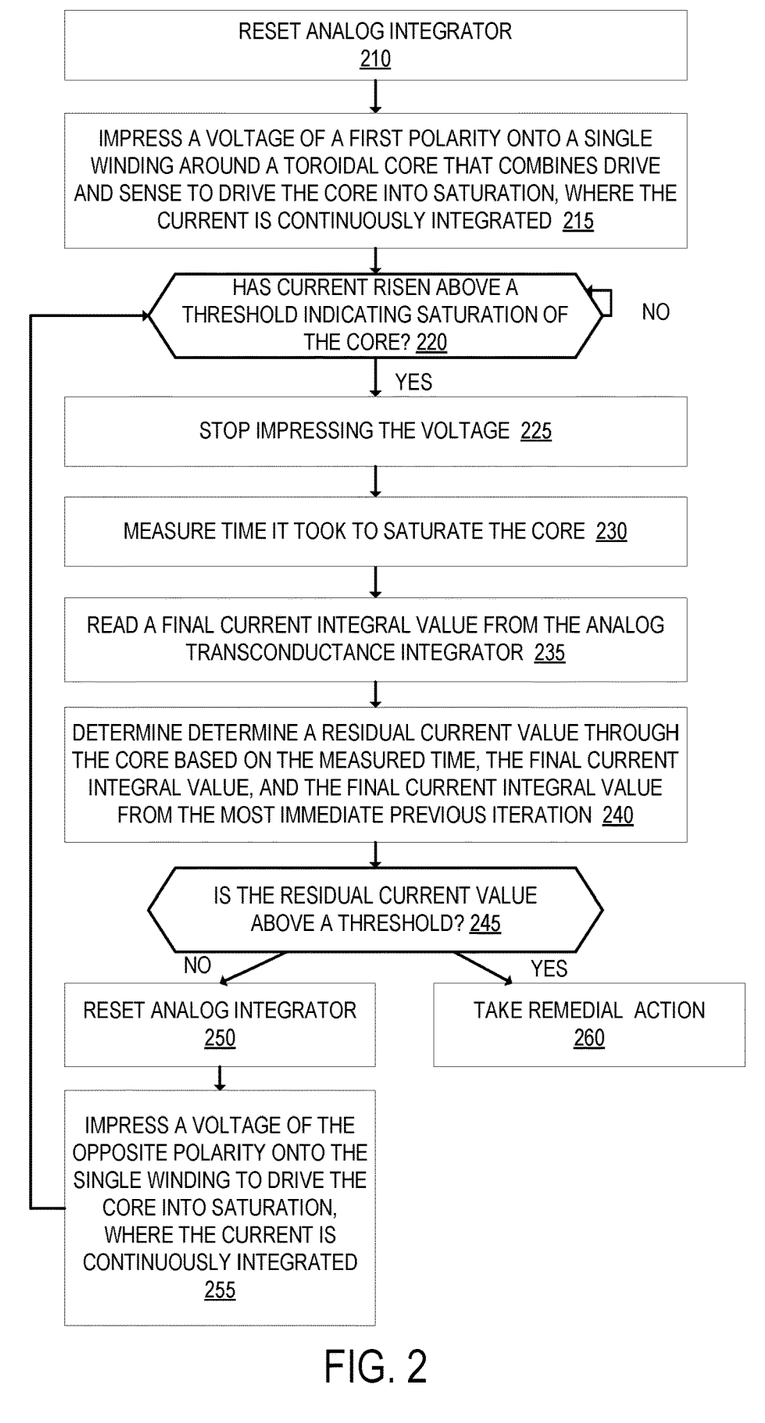
FIG. 2 is a flow diagram that illustrates exemplary operations performed for a single winding core-insensitive fluxgate current sensor according to an embodiment.

FIG. 2 is a flow diagram that illustrates exemplary operations performed for a single winding core-insensitive fluxgate current sensor according to an embodiment. The operations of FIG. 2 are described with respect to the exemplary embodiment of FIG. 1. However, the operations of FIG. 2 can be performed by different embodiments than that of FIG. 1, and the embodiment of FIG. 1 can perform different operations from that of FIG. 2.

At operation 210, the MCU 150 resets the analog integrator including configuring pins connected to the op-amp 168 as GPIOs between analog and op-amp mode dynamically. This charges or discharges, depending on whether the integrator is inverting, the capacitor Cinteg 160. For instance, the CPU 152 resets the op-amp 168 by configuring the pins as GPIOs.

Next, at operation 215, the H-bridge driver 120 impresses a voltage at a first polarity onto a single winding (e.g., the sense and drive winding 115) around the core 105. This causes the current to saturate the core 105. In an embodiment where the core 105 has a square BH-curve characteristic, the saturation is at approximately the coercive force (Hc) of the core 105. For instance, the PWM generator 154 asserts an enable signal to the enable pin 142 to impress the voltage onto the front-end core 105. The direction input signals the differential coil magnetization direction (e.g., clockwise when off, counterclockwise when on). The PWM generator 154 is reset from the output of the comparator 170. The current is continuously integrated into the capacitor Cinteg 160 with unlimited resolution in the analog domain.

Next, at operation 220, the MCU 150 determines whether the current through the single winding (e.g., the sense and drive winding 115) has risen above a threshold indicating saturation of the core 105, such as when the current through resistor Rsns 138 has reached a threshold (e.g., 100 MA). If the current has risen above a threshold indicating saturation of the core, then flow moves to operation 225. Otherwise, operation 220 is performed until the core has been saturated (the voltage continues to be impressed until the core is saturated).

At operation 225, the h-bridge driver 120 stops impressing the voltage onto the single winding. For instance, the PWM generator 154 stops asserting the enable signal to the enable pin 142. The time from when the voltage is impressed in operation 215 to the time the core is saturated is measured at operation 230. This is referred to as the saturation time. The saturation time value is stored. At operation 235, the final current integral value at the time the h-bridge driver 120 stops driving current (the voltage stored on capacitor Cinteg 160) is read by the ADC 158. This final current integral value is stored.

Next, at operation 240, the MCU 150 determines the residual current through the core based on the saturation time, the final integral value obtained in this iteration, and the final integral value obtained in the immediately previous iteration. If this is the first iteration, there will not be enough information to determine the residual current value. In an embodiment, the residual current is calculated according to the following formula:

$$Iresidual=((Va-Vb)*(Rinteg*Cinteg)/(Rsns)*N)/(2*Saturation\_Time)$$

where Va is the final integral value obtained in this iteration, Vb is the final integral value obtained in the immediately prior iteration, Rinteg is the resistance value of the resistor Rinteg 166 (e.g., 2.2K Ohm), Cinteg is the capacitance value of the capacitor Cinteg 160 (e.g., 10 nF), Rsns is the resistance value of the resistor Rsns 138 (e.g., 4.7 Ohm), N is the number of turns on the combined sense and drive winding (e.g., 20), and Saturation_Time is how long it took to saturate the core in this iteration. The calculation may be performed many times per second (e.g., 4800 times per second).

At operation 245, the MCU 150 determines whether the determined residual current exceeds a threshold (e.g., the threshold may be a value between 4.5 milliamps to 6 milliamps for a DC implementation, and between 15 milliamps to 20 milliamps for an AC implementation). If it does, then remedial action is taken at operation 260. For example, the MCU 150 may cause contactors to open. In some cases, the current sensor 100 may be used in environments where the contactors remain open until they are manually reset. In other cases, the current sensor 100 may be used in environments where the contactors can be remotely reset if certain conditions are met.

If the determined residual current does not exceed the threshold, then operation 250 is performed. At operation 250, the MCU 150 resets the analog integrator including configuring pins connected to the op-amp 168 as GPIOs between analog and op-amp mode dynamically. Next, at operation 255, the H-bridge driver 120 impresses a voltage of the opposite polarity (opposite as compared to the polarity in the previous iteration) onto the single winding (e.g., the sense and drive winding 115) around the core 105. This causes the current to saturate the core 105. In an embodiment where the core 105 has a square BH-curve characteristic, the saturation is at approximately the coercive force (Hc) of the core 105. For instance, the PWM generator 154 asserts an enable signal to the enable pin 142 to impress the voltage onto the front-end core 105. The direction input signals the differential coil magnetization direction (e.g., clockwise when off, counterclockwise when on). The PWM generator 154 is reset from the output of the comparator 170. The current is continuously integrated into the capacitor Cinteg 160 with unlimited resolution in the analog domain. Flow then moves back to operation 220.

Figure 3:
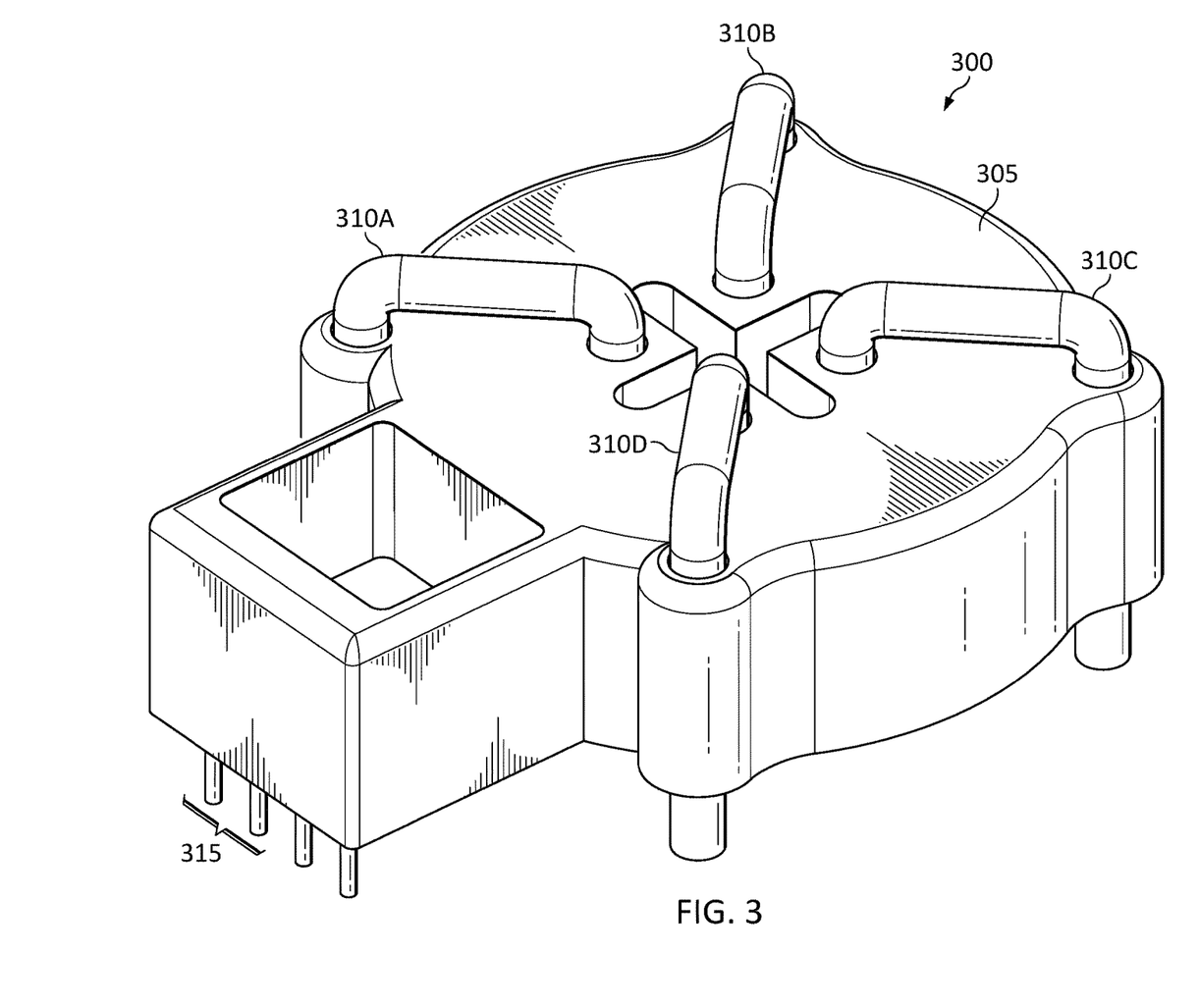
FIG. 3 shows a first view of components of an exemplary open-loop fluxgate-type current sensor according to an embodiment

FIG. 3 shows a first view of components of an exemplary open-loop fluxgate-type current sensor according to an embodiment. The current sensor 100 may take the form of the current sensor 300. The current sensor 300 shows a housing 300 that includes the four primary windings 310A-3110D that take the form of four current conductors. As an example, the current sensor 300 may be used in a three-phase power system where three primary windings are used for power providing phases and one primary winding is used for the neutral conductor. The current sensor 300 measures the residual/leakage current through the primary windings. Two sets of winding pins are also shown in FIG. 3. However, in an embodiment, only a single set of winding pins 315 is used for a single winding (the combined sense and drive winding 115).

Figure 4:
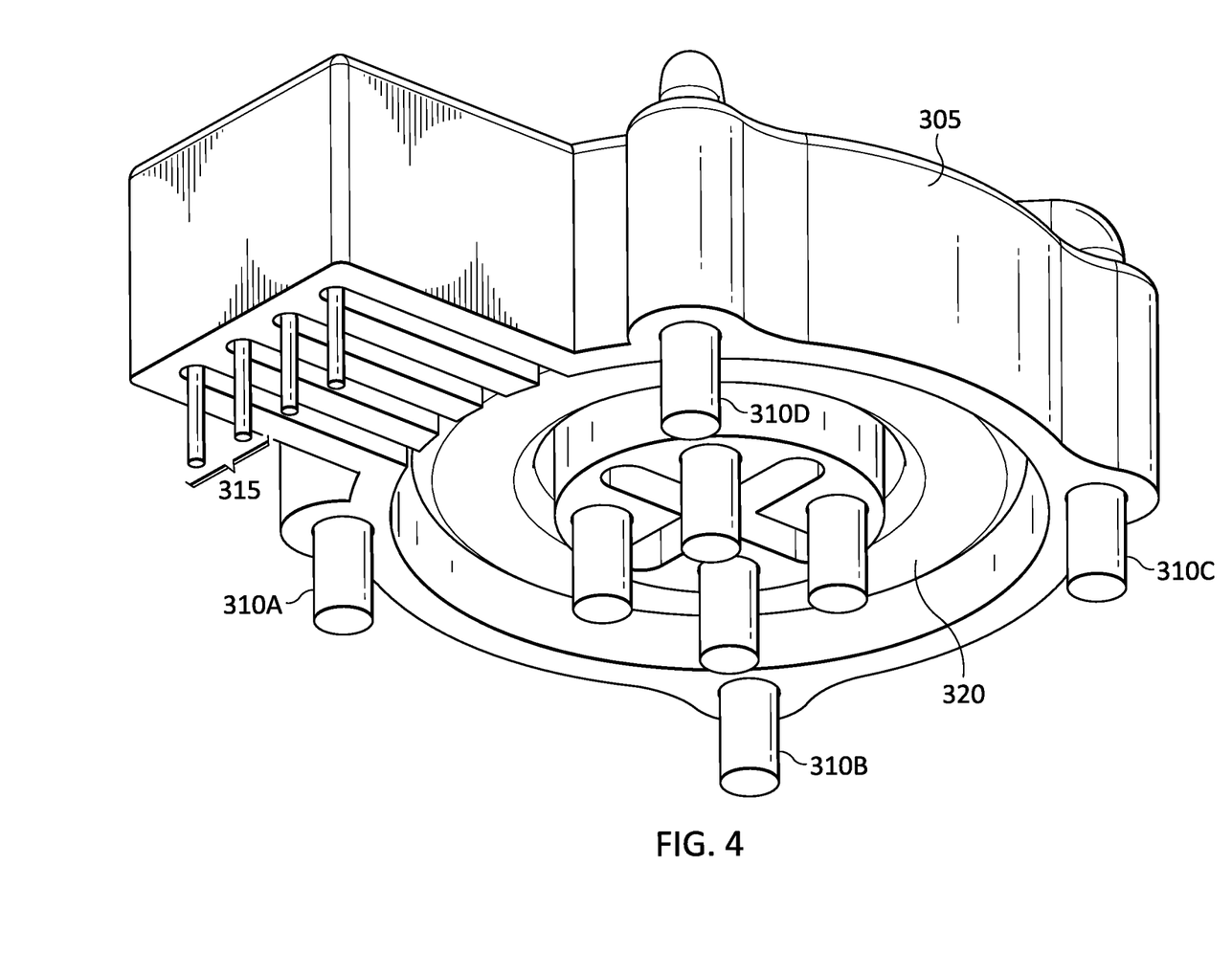
FIG. 4 shows a second view of components of the exemplary open-loop fluxgate-type current sensor of FIG. 3 according to an embodiment.

FIG. 4 shows a second view of components of the exemplary open-loop fluxgate-type current sensor of FIG. 3 according to an embodiment. For illustration purposes, the view in FIG. 4 shows the housing of the current sensor 300 as being transparent. The view is also of a bottom perspective of the current sensor 300. As shown in FIG. 4, the primary windings 310A-310D go through the core 320. The core 320 is shown as a toroidal shape. The core 320 can be made of amorphous or nanocrystalline tape-wound alloys. In another embodiment, the core 320 is made of Ferrite material (e.g., Ferroxcube 3R1), and may be of any kind of shape including a toroidal shape.

Figure 5:
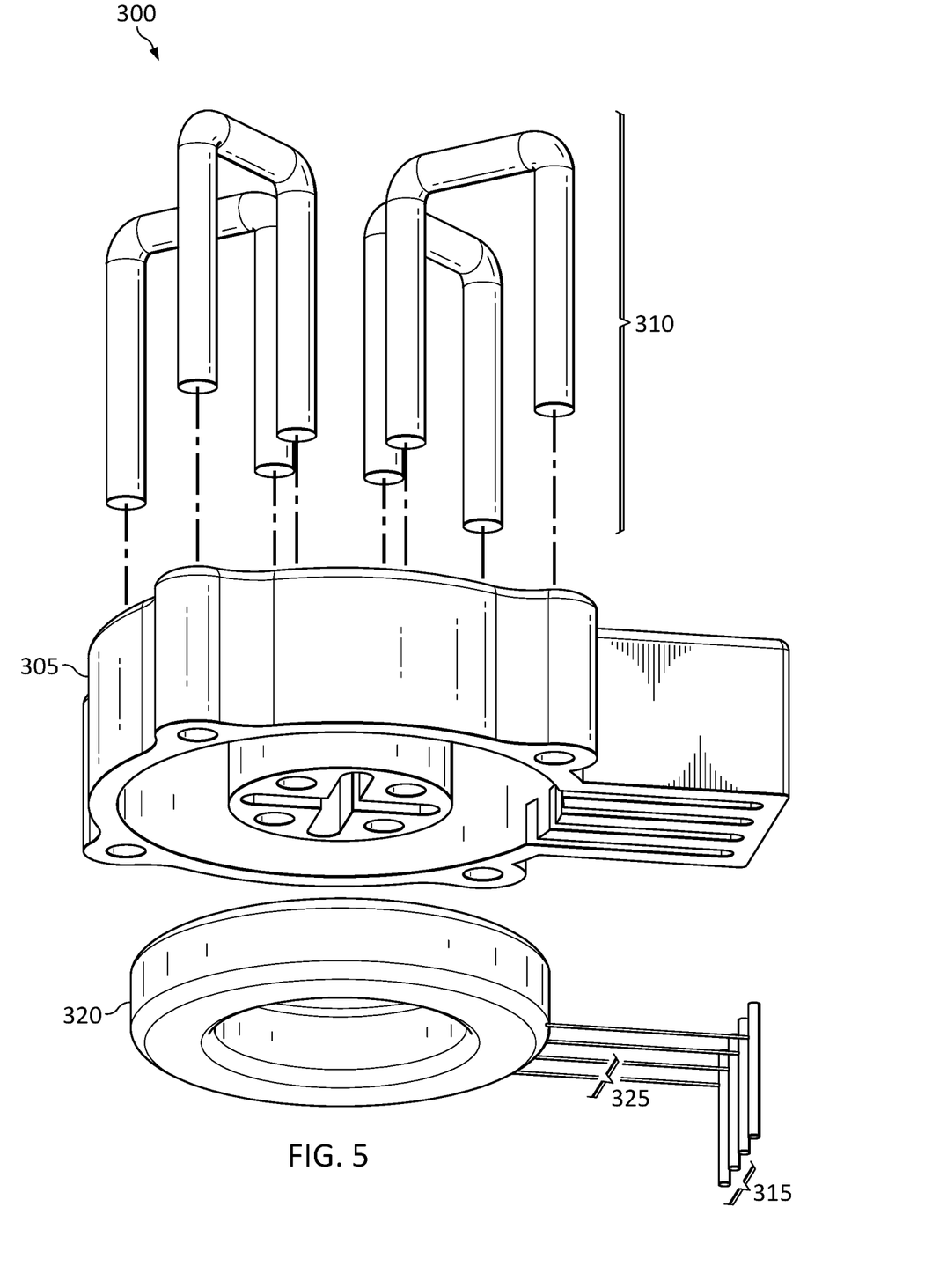
FIG. 5 shows a third view of components of the exemplary open-loop fluxgate-type current sensor of FIG. 3 according to an embodiment.

FIG. 5 shows a third view of components of the exemplary open-loop fluxgate-type current sensor of FIG. 3 according to an embodiment. The view in FIG. 5 shows an exploded view of the current sensor 300 and shows the single sense and drive winding 325.

Figure 6:
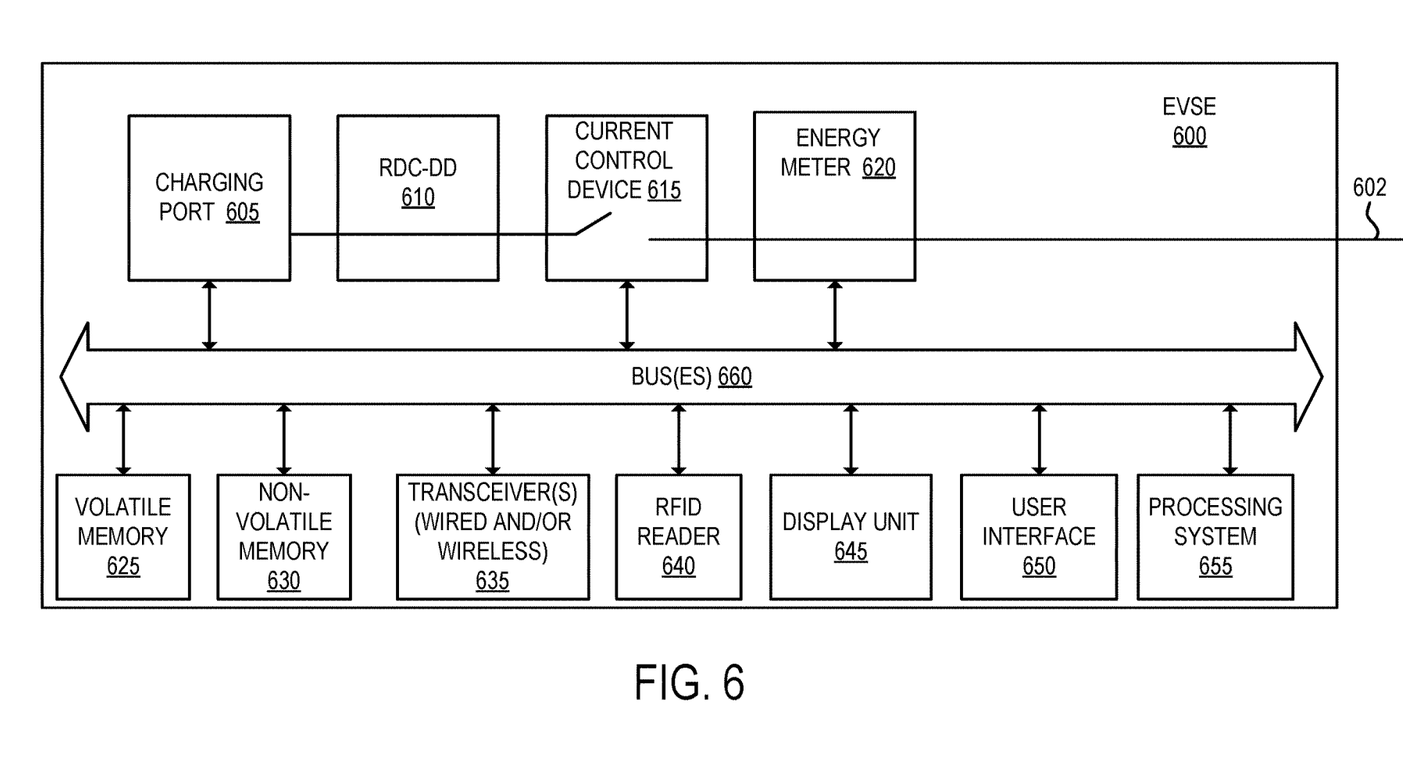
FIG. 6 shows an exemplary embodiment of an electric vehicle service equipment that uses an open-loop fluxgate-type current sensor according to an embodiment.

In an embodiment, the open-loop fluxgate-type current sensor is used as part of a residual direct current detecting device (RDC-DD) of an electric vehicle service equipment (EVSE). FIG. 6 shows an exemplary embodiment of an EVSE that uses an open-loop fluxgate-type current sensor according to an embodiment. FIG. 6 illustrates an exemplary architecture of an EVSE, and other, different architectures may be used in embodiments. Although several components are illustrated as being included in the EVSE 600, in some embodiments additional, different, or less components may be used in the EVSE 600. For example, some EVSE may not include a display or a user interface. Other EVSE may not include an RFID reader or an energy meter.

As illustrated in FIG. 6, the EVSE 600 includes the charging port 605, the RDC-DD 610, the current control device 615, the energy meter 620, the volatile memory 625, the nonvolatile memory 630 (e.g., hard drive, flash, PCM, etc.), one or more transceiver(s) 635 (e.g., wired transceiver(s) (e.g., Ethernet, power line communication (PLC), etc.) and/or wireless transceiver(s) (e.g., 802.15.4 (e.g., ZigBee, etc.), Bluetooth, Wi-Fi, Infrared, GPRS/GSM, CDMA, etc.)), the RFID reader 640, the display unit 645, the user interface 650, and the processing system 655 (e.g., one or more microprocessors and/or a system on an integrated circuit), which may be coupled with one or more buses 660.

The charging port 605 is a power receptacle, circuitry for an attached charging cord (e.g., with a SAE J1772 connector), or circuitry for inductive charging. The charging port 605 provides a connection for an electric vehicle to connect to the EVSE 600. While FIG. 6 illustrates a single charging port 605, the EVSE 600 may include multiple charging ports and which may be the same or different types.

The RDC-DD 610 includes the open-loop fluxgate-type current sensor as described herein. The RDC-DD 610 may be compliant to IEC 62955, Residual direct current detecting device (RDC-DD) to be used for mode 3 of charging of electric vehicles. The RDC-DD 610 calculates the residual current and if the calculated residual current exceeds a threshold (e.g., above 6 milliamps), the RDC-DD 610 may cause remedial action to be taken such as causing the contactors to open or otherwise preventing an electric vehicle from charging through the charging port 605.

The current control device 615 controls the current flowing on the power line 602. For example, in some embodiments the current control device 615 energizes the charging port 605 (e.g., by completing the circuit to the power line 602) or de-energizes the charging port 605 (e.g., by breaking the circuit to the power line 602). The current control device 615 may be a set of contactors. In some embodiments the current control device 615 energizes the charging port 605 responsive to receiving a command from a server that indicates that an electric vehicle operator is authorized to use the charging port.

The energy meter 620 measures the amount of electricity that is flowing on the power line 602 through the charging port 605. While in one embodiment the energy meter 620 measures current flow, in an alternative embodiment the energy meter 620 measures power draw. The energy meter 620 may be an induction coil or other devices suitable for measuring electricity. In some embodiments, the energy meter 620 is a programmable time of use energy meter (e.g., programmed according to the prices and time periods defined by the owner or operator of the EVSE). While the energy meter 620 is illustrated as being included within the EVSE 600, in other embodiments the energy meter 620 is exterior to the EVSE 600 but capable of measuring the amount of electricity flowing on the power line 602 through the charging port 605.

The RFID reader 640 reads RFID tags from RFID enabled devices (e.g., smartcards, key fobs, contactless credit cards, etc.), embedded with RFID tag(s) of operators that want to use the charging port 605 of the EVSE 600. For example, in some embodiments a vehicle operator can wave/swipe an RFID enabled device near the RFID reader 630 to provide an access credential for use of the charging port 605. Electric vehicle operators may use the RFID reader 640 for payment. In addition to an RFID reader, the EVSE 600 may also include a credit card reader.

The transceiver(s) 635 transmit and receive messages. For example, the transceiver(s) 635 may transmit authorization requests to the EV charging network server, receive commands from the EV charging network server indicating whether the charging session is authorized, etc.

The display unit 645 is used to display messages to vehicle operators including charging status, confirmation messages, error messages, notification messages, etc. The display unit 645 may also display parking information if the EVSE 600 is also acting as a parking meter (e.g., amount of time remaining in minutes, parking violation, etc.).

The user interface 650 allows users to interact with the EVSE 600. By way of example, the user interface 650 allows electric vehicle operators to present an access credential, enter in account and/or payment information, etc.

The processing system 655 may retrieve instruction(s) from the volatile memory 625 and/or the nonvolatile memory 630 and execute the instructions to perform operations for the electric vehicle charging station.

Although FIG. 6 shows the RDC-DD 610 between the charging port 605 and the current control device 615, the RDC-DD 610 can instead be before the current control device 615 and/or the energy meter 620 on the charging line 602.

In the preceding description, numerous specific details are set forth to provide a more thorough understanding. It will be appreciated, however, by one skilled in the art that embodiments may be practiced without such specific details. In other instances, control structures, gate level circuits and full software instruction sequences have not been shown in detail in order not to obscure understanding. Those of ordinary skill in the art, with the included descriptions, will be able to implement appropriate functionality without undue experimentation.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether explicitly described.

Bracketed text and blocks with dashed borders (e.g., large dashes, small dashes, dot-dash, and dots) may be used herein to illustrate optional operations that add additional features to embodiments of the invention. However, such notation should not be taken to mean that these are the only options or optional operations, and/or that blocks with solid borders are not optional in certain embodiments of the invention.

In the preceding description and the claims, the terms "coupled" and "connected," along with their derivatives, may be used. These terms are not intended as synonyms for each other. "Coupled" is used to indicate that two or more elements, which may or may not be in direct physical or electrical contact with each other, co-operate or interact with each other. "Connected" is used to indicate the establishment of communication between two or more elements that are coupled with each other.

While the flow diagrams in the figures show a particular order of operations performed by certain embodiments of the invention, such order is exemplary (e.g., alternative embodiments may perform the operations in a different order, combine certain operations, overlap certain operations, etc.).

While the invention has been described in terms of several embodiments, those skilled in the art will recognize that the invention is not limited to the embodiments described, can be practiced with modification and alteration within the spirit and scope of the appended claims. The description is thus to be regarded as illustrative instead of limiting.

What is claimed is:

1. A method, comprising:
    signaling an H-bridge driver to impress a first voltage of a first polarity onto a single winding that combines drive and sense that is used as both an excitation source and a feedback element to measure current through a primary winding, wherein the single winding is around a core, wherein impressing the first voltage of the first polarity onto the single winding causes first current to rise to saturate the core, and wherein the first current is continuously integrated by an analog transconductance integrator;
    detecting that the first current through the single winding has risen above a threshold indicating saturation of the core, and responsive to this detecting:
        signaling the H-bridge driver to stop impressing the first voltage of the first polarity onto the single winding, and
        receiving a first current integral value from the analog transconductance integrator;
    resetting the analog transconductance integrator;
    signaling the H-bridge driver to impress a second voltage of a second polarity onto the single winding, wherein impressing the second voltage of the second polarity onto the single winding causes second current to rise to saturate the core, and wherein the second current is continuously integrated by the analog transconductance integrator;
detecting that the second current through the single winding has risen above the threshold indicating saturation of the core, and responsive to this detecting:
signaling the H-bridge driver to stop impressing the second voltage of the second polarity onto the single winding, and
receiving a second current integral value from the analog transconductance integrator; and
determining a residual current value through the core based on at least:
a time value from signaling the H-bridge driver to impress the second voltage onto the single winding to detecting that the second current through the single winding has risen above the threshold indicating saturation of the core,
the first current integral value, and
the second current integral value.

2. The method of claim 1, wherein the core is a toroidal shape.

3. The method of claim 1, wherein the core is a square Ferrite material.

4. The method of claim 1, further comprising:
determining that the determined residual current value exceeds a threshold, and responsive to this determination, taking a remedial action.

5. The method of claim 4, wherein the remedial action includes causing a set of one or more contactors to open to prevent current from flowing.

6. The method of claim 1, wherein saturation of the core is at approximately a coercive force of the core.

7. The method of claim 1, further comprising:
determining that the determined residual current value does not exceed a threshold, and responsive to this determination, resetting the analog transconductance integrator.

8. The method of claim 1, wherein resetting the analog transconductance integrator includes configuring pins connected to an operational amplifier of a microcontroller as general-purpose input/output (GPIO) pins.

9. An open-loop fluxgate-type current sensor, comprising:
a single winding around a core that combines drive and sense that is used as both an excitation source and a feedback element to measure current through a primary winding;
an H-bridge driver to impress voltage to the single winding to cause current to saturate the core, the voltage being impressed with opposing polarities repeatedly causing the core to saturate at opposing polarities;
an analog transconductance integrator that continuously integrates the current to infer magnetizing force being driven into the core at the opposing polarities; and
a microcontroller unit (MCU) that calculates residual current based on the inferred magnetizing force being driven into the core at the opposing polarities and cause remedial action to be taken when the calculated residual current exceeds a threshold.

10. The open-loop fluxgate-type current sensor of claim 9, wherein the core is a toroidal shape.

11. The open-loop fluxgate-type current sensor of claim 9, wherein the core is a square Ferrite material.

12. The open-loop fluxgate-type current sensor of claim 9, wherein the open-loop fluxgate-type current sensor is used as part of a residual direct current detecting device of an electric vehicle service equipment.

13. The open-loop fluxgate-type current sensor of claim 9, wherein the MCU is to signal the H-bridge driver to impress the voltage to the single winding.

14. The open-loop fluxgate-type current sensor of claim 9, wherein the analog transconductance integrator includes:
a sense shunt resistor that measures real-time current going through the single winding and provide a voltage to the MCU, and
an operational amplifier that integrates the voltage provided by the sense shunt resistor into a capacitor.

15. An electric vehicle supply equipment (EVSE), comprising:
a charging port that provides a connection to the EVSE for an electric vehicle;
a current control device that controls current flowing on a power line connected to the charging port; and
a residual direct current detecting device that includes an open-loop fluxgate-type current sensor, the open-loop fluxgate-type current sensor including:
a single winding around a core that combines drive and sense that is used as both an excitation source and a feedback element to measure current through a primary winding,
an H-bridge driver to impress voltage to the single winding to cause current to saturate the core, the voltage being impressed with opposing polarities repeatedly causing the core to saturate at opposing polarities,
an analog transconductance integrator that continuously integrates the current to infer magnetizing force being driven into the core at the opposing polarities, and
a microcontroller unit (MCU) that calculates residual current based on the inferred magnetizing force being driven into the core at the opposing polarities and cause remedial action to be taken when the calculated residual current exceeds a threshold.

16. The EVSE of claim 15, wherein the core is a toroidal shape.

17. The EVSE of claim 15, wherein the core is a square Ferrite material.

18. The EVSE of claim 15, wherein the MCU is to signal the H-bridge driver to impress the voltage to the single winding.

19. The EVSE of claim 15, wherein the analog transconductance integrator includes:
a sense shunt resistor that measures real-time current going through the single winding and provide a voltage to the MCU, and
an operational amplifier that integrates the voltage provided by the sense shunt resistor into a capacitor.

* * * * *